(12) United States Patent
Chen et al.

(10) Patent No.: US 9,142,534 B2
(45) Date of Patent: Sep. 22, 2015

(54) LIGHT-EMITTING DEVICE

(75) Inventors: Chao-Hsing Chen, Hsinchu (TW);
Schang-Jing Hon, Taichung (TW);
Alexander Chan Wang, Hsinchu (TW);
Li-Tian Liang, Hsinchu (TW);
Chin-Yung Fan, Hsinchu (TW);
Chien-Kai Chung, Hsinchu (TW);
Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 463 days.

(21) Appl. No.: 13/148,544

(22) PCT Filed: Oct. 13, 2009

(86) PCT No.: PCT/CN2009/074422
§ 371 (c)(1),
(2), (4) Date: Nov. 14, 2011

(87) PCT Pub. No.: WO2010/088823
PCT Pub. Date: Aug. 12, 2010

(65) Prior Publication Data
US 2012/0049213 A1 Mar. 1, 2012

(30) Foreign Application Priority Data

Feb. 9, 2009 (CN) .......................... 2009 1 0007059

(51) Int. Cl.
| | |
|---|---|
| H01L 27/15 | (2006.01) |
| H01L 27/02 | (2006.01) |
| H01L 25/065 | (2006.01) |
| H01L 25/075 | (2006.01) |
| H01L 27/32 | (2006.01) |
| H01L 33/62 | (2010.01) |

(52) U.S. Cl.
CPC ............ *H01L 25/0753* (2013.01); *H01L 27/15* (2013.01); *H01L 27/3211* (2013.01); *H01L 33/62* (2013.01); *H01L 2224/48091* (2013.01); *H01L 2224/48137* (2013.01); *H01L 2224/8592* (2013.01); *H01L 2924/12032* (2013.01); *H01L 2924/30107* (2013.01)

(58) Field of Classification Search
None
See application file for complete search history.

(56) References Cited

U.S. PATENT DOCUMENTS

| | | | |
|---|---|---|---|
| 7,221,044 B2 | 5/2007 | Fan et al. | |
| 7,419,839 B2 | 9/2008 | Camras et al. | |
| 2006/0158130 A1* | 7/2006 | Furukawa | ................. 315/200 R |
| 2006/0163589 A1* | 7/2006 | Fan et al. | ......................... 257/88 |
| 2007/0103899 A1* | 5/2007 | Takikawa | ..................... 362/227 |
| 2007/0217476 A1 | 9/2007 | Yoshikawa et al. | |

(Continued)

FOREIGN PATENT DOCUMENTS

| | | |
|---|---|---|
| CN | 2657203 Y | 11/2004 |
| CN | 1828921 A | 9/2006 |

(Continued)

*Primary Examiner* — Johannes P Mondt
(74) *Attorney, Agent, or Firm* — Ditthavong & Steiner, P.C.

(57) ABSTRACT

A light-emitting device is provided that is capable of being directly connected to an alternative current source, including at least one electronic element; at least one light-emitting diode array chip; at least one bonding pad, a conductive trace, and a submount for supporting the electronic element, the light-emitting diode array chip, the bonding pad, and the conductive trace. The conductive trace is electrically connected to the electronic element, the light-emitting diode array chip, and bonding pad.

15 Claims, 8 Drawing Sheets

(56) References Cited

U.S. PATENT DOCUMENTS

2008/0191632 A1 8/2008 Lee
2010/0109558 A1* 5/2010 Chew .......................... 315/294

FOREIGN PATENT DOCUMENTS

| CN | 1983594 A | 6/2007 |
| WO | WO 2010/088823 A1 | 8/2010 |

* cited by examiner

LIGHT-EMITTING DEVICE

CROSS-REFERENCE TO RELATED APPLICATION

The present application is a national stage application of PCT Application No. PCT/CN2009/074422, filed on Oct. 13, 2009, and claims priority to Chinese Application No. 200910007059.2, filed on Feb. 9, 2009, the entire contents of which are herein incorporated by reference.

TECHNICAL FIELD

The application relates to a light-emitting device, and more particularly to a light-emitting device having at least one electronic element and at least one light-emitting diode array chip, which are arranged on a submount, and can be directly used with an alternative current source.

DESCRIPTION OF BACKGROUND ART

Light-emitting diode (LEDs) can emit light energy in the presence of energy difference resulted from the movement of electrons between the n-type semiconductor and the p-type semiconductor. With this mechanism, the LEDs can generate cool light in contrary to incandescent bulbs. Besides, the LEDs are durable and compact, and have long lifespan and low energy-consumption. Accordingly, the LEDs become promising candidates in the market to be the next-generation lighting products in place of the conventional lighting sources, and are already applied to various fields such as traffic lights, backlight modules, street lights, and medical equipment.

Figure 1:
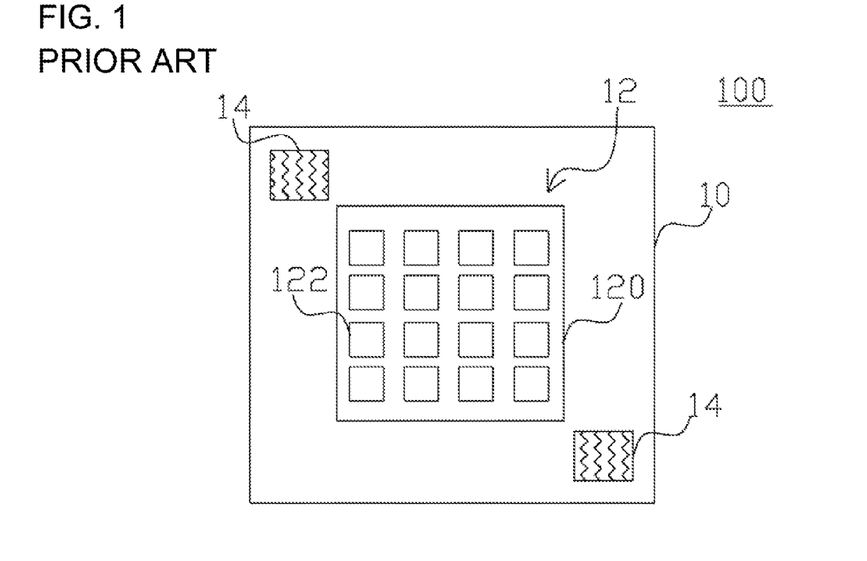
FIG. 1 illustrates a known light-emitting diode element used with an alternative current power source.

As shown in FIG. 1, a light-emitting diode element 100, which can be adapted to an alternative current power source, includes a submount 10, a light-emitting diode array chip 12 on the submount 10, and at least one bonding pad 14 electrically connected to the light-emitting diode array chip 12. The light-emitting diode array chip 12 includes a substrate 120 and several light-emitting diode units 122 on the substrate 120.

To replace a conventional lighting device, the light-emitting diode element 100 must work on a high voltage condition of 100V~240V, which may bring about a high temperature issue after long time operation. Under the high voltage and high temperature conditions, an electromigration effect, which is a result of a movement of metal ions caused by a mixed effect of the temperature and the electron wind, can be easily found in an electronic device. Generally, the electromigration of metal ions occurs easily at high temperature. In the light-emitting diode element, the metal ions may diffuse from the electrode to the active region by the effect of the electric current at high temperature. For example, the electromigration may occur easily in the electrode material such as indium tin oxide (ITO) and silver. Moreover, the element may fail due to voids caused by the electromigration in the solder or tiny metal connection.

As described above, the reliability of the light-emitting diode element for alternative current usage can be seriously deteriorated at high temperature and high voltage environment.

SUMMARY OF THE DISCLOSURE

A light-emitting device in accordance with one embodiment of the present application includes a submount, at least one electronic element on the submount, and at least one light-emitting diode array chip arranged on the submount and electrically connected to the electronic element.

In another embodiment, a bonding pad is provided on the submount and electrically connected to the electronic element and the light-emitting diode array chip. The light-emitting device is coupled to a high voltage alternative current power source through the bonding pad.

In another embodiment, the electronic element can be a passive element such as a rectifying unit, a resister unit, a capacitor unit, and an inductor unit. With the adoption of the unit(s), the efficiency of the light-emitting device can be improved.

A light-emitting device in accordance with another embodiment of the present application includes at least one light-emitting diode array chip which includes several light-emitting diode units connected with each other in series or parallel.

A light-emitting device in accordance with further embodiment of the present application includes at least one light-emitting diode array chip which includes several light-emitting diode units arranged in a serially-connected closed loop.

A light-emitting device in accordance with an embodiment of the present application includes at least one light-emitting diode array chip which includes several light-emitting diode units arranged to form serially-connected close loop. Any two neighboring closed loops have different connection directions and share a common portion.

A light-emitting device in accordance with another embodiment of the present application includes at least one submount, at least one electronic element on the submount, at least one blue light-emitting diode array chip on the submount, at least one red light-emitting diode chip on the submount, and a conductive trace arranged on the submount and electrically connecting the electronic element with the blue light-emitting diode array chip, and the red light-emitting diode chip.

DETAILED DESCRIPTION OF PREFERRED EMBODIMENTS

The embodiments are described hereinafter in accompany with drawings.

Figure 2A:
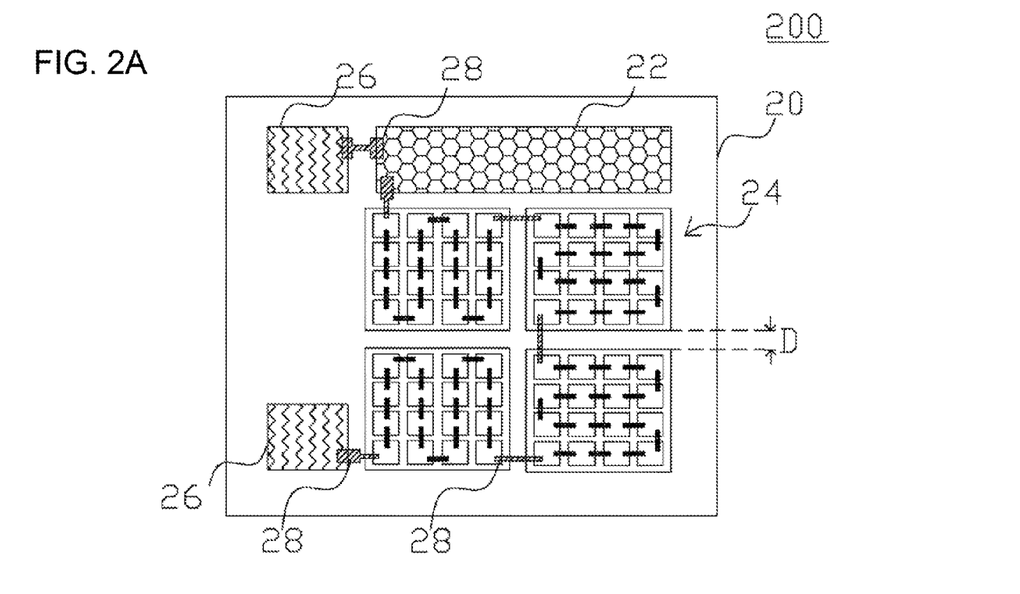
FIG. 2A is a top view of a structure in accordance with an embodiment of the present application.
Figure 2B:
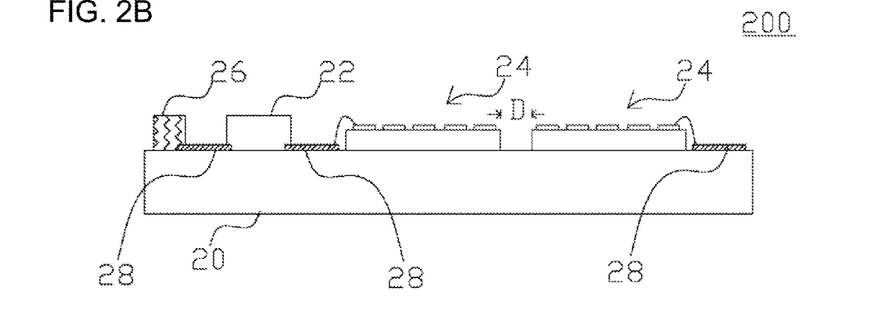
FIG. 2B is a side view of a structure in accordance with an embodiment of the present application.

As shown in FIGS. 2A and 2B, a light-emitting device 200 includes a submount 20, at least one electronic element 22 which is positioned on the submount 20, a plurality of light-emitting diode array chips 24 which are positioned on the submount 20, a bonding pad 26 which is positioned on the submount 20, and a conductive trace 28 which is positioned on the submount 20 and used to connect the electronic element 22 with the light-emitting diode array chip(s) 24 and the bonding pad 26 in series or parallel. Any two neighboring light-emitting diode array chips 24 are spaced apart by a gap D which can be greater than 10 μm, preferably greater than 100 μm. The bonding pad 26 is electrically connected to an alternative current (AC) power source/supply (not shown). The AC power source can provide a high voltage AC power, such as 100V to 240V for household appliance(s), to the light-emitting device 200.

The electronic element 22 can be one or more passive elements, such as rectifier(s), resistor(s), capacitor(s), and inductor(s).

Figure 2C:
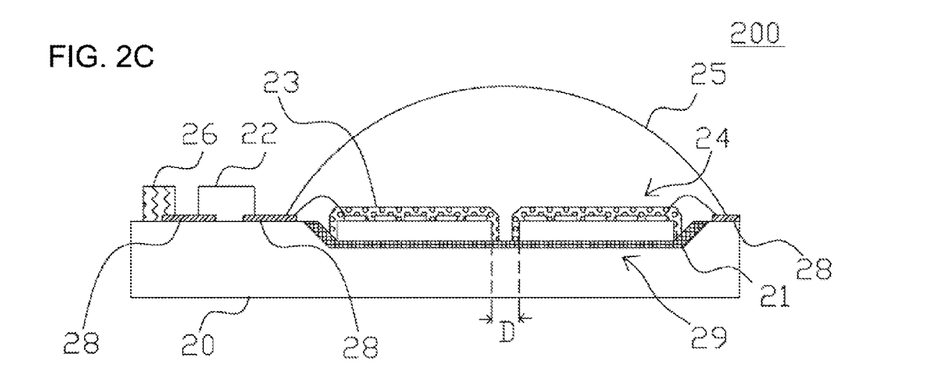
FIG. 2C is a side view of a structure in accordance with another embodiment of the present application.

As shown in FIG. 2C, the light-emitting device 200 further includes a reflecting layer 21 which is arranged on the submount 20 and used to reflect light emitted from the light-emitting diode array chip(s) 24. The submount 20 can have a recess structure 29 for accommodating the electronic element 22, or the light-emitting diode array chip(s) 24. In addition, the light-emitting device 200 further includes a wavelength converting layer 23 which is arranged on the light-emitting diode array chip 24, and an encapsulation material 25 which is overlaid on the light-emitting diode array chip(s) 24.

Figure 3:
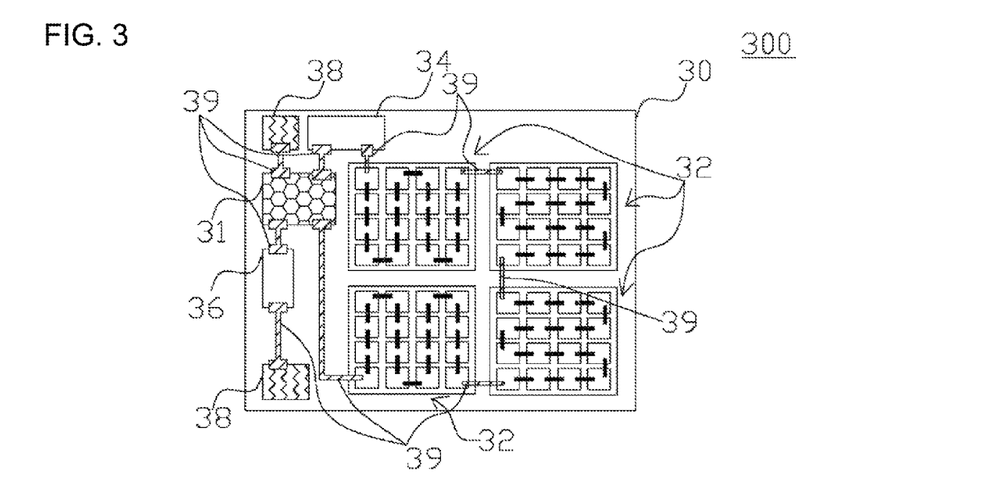
FIG. 3 is a top view of a structure in accordance with an embodiment of the present application.

As shown in FIG. 3, a light-emitting device 300 includes a submount 30, a rectifier 31 which is positioned on the submount 30, a plurality of light-emitting diode array chips 32 which are positioned on the submount 30, a resister 34 which is positioned on the submount 30 and connected to the light-emitting diode array chip(s) 32 in series, a capacitor 36 which is positioned on the submount 30 and connected to the light-emitting diode array chip(s) 32 and the resister 34 in series, a bonding pad 38 which is positioned on the submount 30, and a conductive trace 39 which is positioned on the submount 30 and used to electrically connect the rectifier 31 with the light-emitting diode array chip(s) 32, the capacitor 34, the resister 36, and the bonding pad 38. The rectifier 31 can include a bridge circuit which is an arrangement of diode(s) having low forward voltage and high reverse voltage. With the rectifier 31, a sine wave alternative current provided by the AC power source can be converted to a pulse-mode direct current (DC) for use in the light-emitting device 300. The diode which has low forward voltage and high reverse voltage, can be a Zener diode or a Schottky diode, and made of material(s) of III-V compound or IV element, such as GaN series material, AlGaInP series material, and silicon. In addition, any two neighboring light-emitting diode array chips 32 are spaced apart by a gap greater than 10 μm, preferably greater than 100 μm. The bonding pad 38 is electrically connected to an alternative current (AC) power source/supply (not shown). The AC power source can provide a high voltage AC power, such as 100V to 240V for household appliance(s), to the light-emitting device 300.

Figure 4:
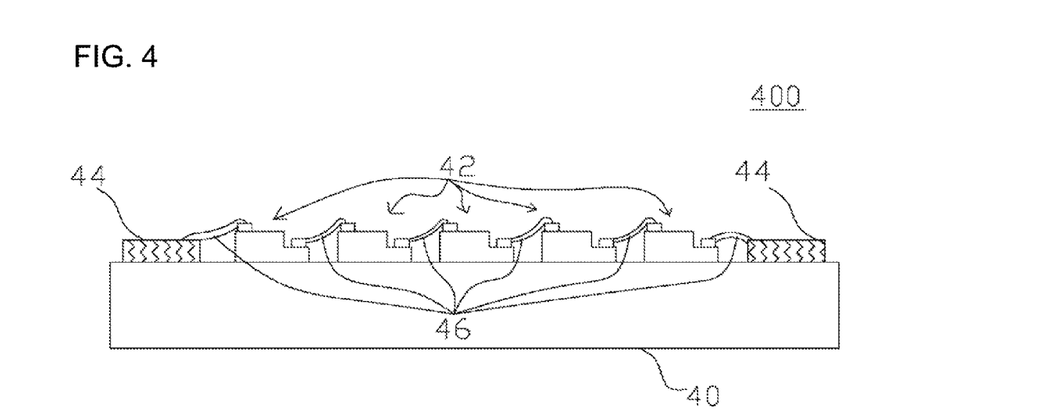
FIG. 4 is a side view of a light-emitting diode array chip in accordance with an embodiment of the present application.

As shown in FIG. 4, the light-emitting diode array chip 400 includes a substrate 40, a plurality of light-emitting diode units 42 which are arranged on the substrate 40, at least two electrodes 44 arranged on the substrate 40, and electrical-connection structures 46 which electrically connect the light-emitting diode units 42 with the electrodes 44 in series or parallel. The electrical-connection structure 46 can include metal wire(s), or metal layer(s). The electrodes 44 are used to electrically connect to the conductive trace(s) disclosed in the aforementioned embodiment(s) (not shown). Moreover, the light-emitting diode array chip 400 can have several working voltages by changing the numbers and the connection of the light-emitting diode units 42. With the flexible voltage design of each light-emitting diode array chip 400 and the series connection of several light-emitting diode array chips 400, the light-emitting device of the present embodiment can meet the voltage condition(s) for general household appliance(s), such as 100V to 240V.

Referring to FIGS. 2~4, an alternative current power system of 110 volts, which can be adapted to a general lighting system, is illustrated. The light-emitting diode array chips are arranged in a 2×2 matrix (as shown in FIG. 3). At least one of the light-emitting diode chips 32 includes a light-emitting layer of InGaN, which can emit a blue light with a peak wavelength ranged between 440 nm~480 nm (hereinafter defined as "blue light-emitting diode array chip"). In addition, at least one of the light-emitting diode array chips 32 includes a light-emitting layer of AlGaInP, which can emit a red light with a peak wavelength ranged between 600 nm~650 nm (hereinafter defined as "red light-emitting diode array chip"). A wavelength converting layer, which can absorb a blue light from the blue light-emitting diode array chip and generate a yellow light with a peak wavelength ranged between 570 nm~595 nm, is overlaid on the blue light-emitting diode array chip (hereinafter defined as "yellow phosphor"), such as YAG phosphor or TAG phosphor, as shown in FIG. 2C. The blue light and the yellow light can be mixed into a white light. To generate various color temperatures, an adjustment can be made to change numbers of the blue light-emitting diode array chip(s) and/or the red light-emitting diode array chip(s), areas of the blue light-emitting diode array chip(s) and/or the red light-emitting diode array chip(s), numbers of the light-emitting diode units in the blue light-emitting diode array chip(s) and/or the red light-emitting diode array chip(s). Or a phosphor, which can generate another color light, can be used, such as green phosphor. The embodiments are listed in following table; moreover, the second embodiment is described in detail below.

| embodiment | AC power system | Numbers of blue light-emitting diode array chip(s) | Numbers of blue light-emitting diode unit(s) | Numbers of red light-emitting diode array chip(s) | Numbers of red light-emitting diode unit(s) |
|---|---|---|---|---|---|
| 1 | AC 110 V | 2 | 12 | 2 | 6 |
| 2 | AC 110 V | 3 | 8 | 1 | 12 |
| 3 | AC 220 V | 2 | 24 | 2 | 12 |
| 4 | AC 220 V | 3 | 16 | 1 | 24 |

In the second embodiment listed in the table, the light-emitting device emits a warm white light. The power ratio of all blue light-emitting diode array chip(s) to all red light-emitting diode array chip(s) is about 3:1. For example, there are three blue light-emitting diode array chips and one red light-emitting diode array chip. Each blue light-emitting diode array chip has eight light-emitting diode units (hereinafter defined as "blue light-emitting diode units") which are connected in series. The red light-emitting diode array chip has twelve light-emitting diode units (hereinafter defined as "red light-emitting diode units") which are connected in series. Therefore, in one light-emitting device, the quantity ratio of all blue light-emitting diode units to all red light-emitting diode units is 24:12 (2:1). Provided one blue light-emitting diode unit has a forward voltage of about 3V and one red light-emitting diode unit has a forward voltage of about 2V, each of the blue and red light-emitting diode array chips can work on 24V, which can be called as a high voltage direct current (DC) array chip. Consequently, the light-emitting diode array chips of the 2×2 matrix can work on 96V. When the light-emitting device is driven to emit the blue light and the red light, the power ratio of the blue light to the red light is about 3:1. Provided the light-emitting diode array matrix is serially connected to a predetermined resister and the aforementioned rectifier having a bridge circuit, the light-emitting device can be used in an AC power system of 110V. In the present embodiment, the power ratio of all blue light-emitting diode array chip(s) to all red light-emitting diode array chip (s) is about 2~4, preferably 2.6~3.4. Moreover, the quantity ratio of all blue light-emitting diode unit(s) to all red light-emitting diode unit(s) can be set in a range of about 4/3~8/3, which can generate a warm white light whose color temperature is between 2000K and 5000K, preferably between 2000K and 3500K. In another embodiment, the red light-emitting diode array chip can be replaced by several non-array-type red light-emitting diode chips which are connected with each other in series. The quantity of the non-array-type red light-emitting diode chips is equal to the quantity of all red light-emitting diode units in the replaced red light-emitting diode array chip. In specific, the non-array-type red light-emitting diode chip has only one red light-emitting diode unit whose forward voltage is about 2V.

Figure 5A:
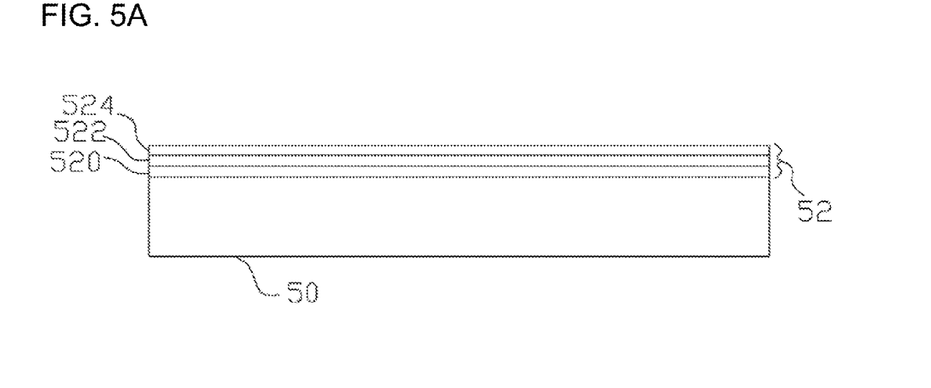
FIGS. 5A~5D illustrate processes of making a light-emitting diode array chip in accordance with an embodiment of the present application.

As shown in FIG. 5A, a substrate 50 is provided. An epitaxial stacked layer 52 is then formed on the substrate 50 by metal-organic chemical vapor deposition (MOCVD). The epitaxial stacked layer 52 includes a first conductivity type semiconductor layer 520, an active layer 522, and a second conductivity type semiconductor layer 524. The epitaxial stacked layer 52 can be made of semiconductor material(s) comprising at least one element selected from Al, Ga, In, N, P, and As, such as GaN and AlGaInP.

Figure 5B:
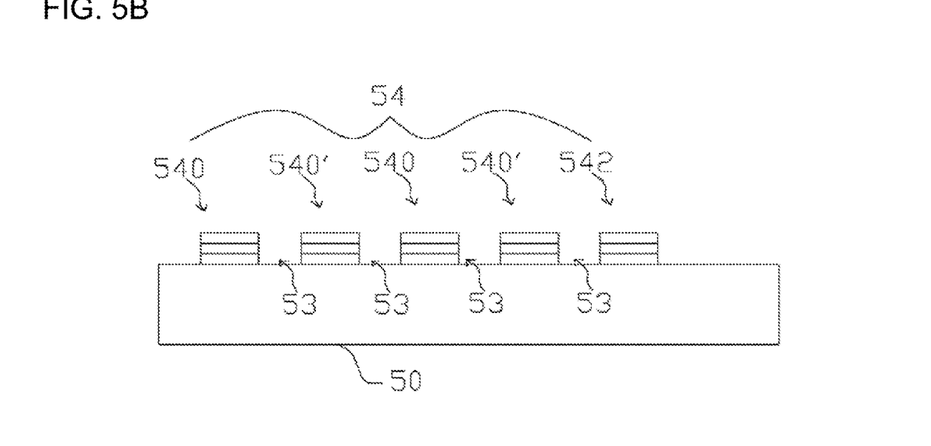

As shown in FIG. 5B, several trenches 53 are formed by etching the epitaxial stacked layer 52 with the lithography scheme, such that several diode units 54, which includes light-emitting diode units 540/540' and a rectifying diode unit 542, are formed on the substrate 50. The diode unit 54 can be epitaxially grown on the substrate 50. Alternatively, the diode unit 54 can be bonded to another substrate by bonding layer(s) or pressure/thermal bonding, such that the substrate 50 is removed and replaced by another substrate (hereinafter, the scheme is called "double substrate transfer"). For example, the substrate 50 is replaced by another substrate having a higher thermal conductivity or a high transparency, such that the thermal dissipation or the light extraction efficiency of the light-emitting diode array chip can be improved. For the red light-emitting diode array chip or the non-array-type red light-emitting diode chip, in one embodiment, the red light-emitting diode unit can be bonded to a high conductivity substrate or a transparent substrate by metal, oxide, or organic polymer.

Figure 5C:
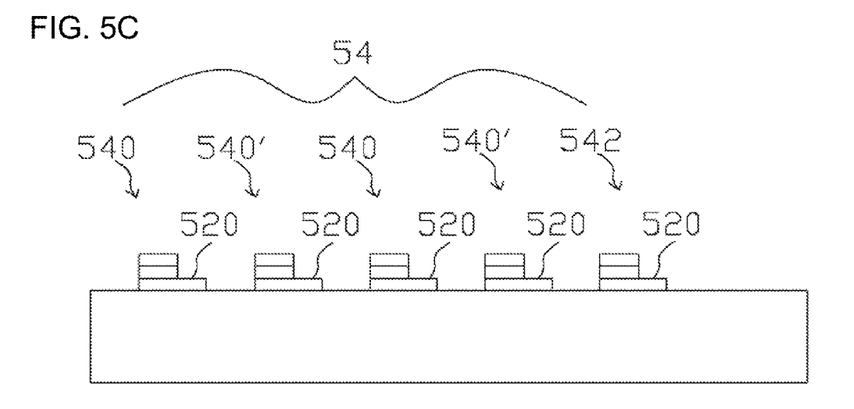

As shown in FIG. 5C, the diode units 54 are then etched with the lithography scheme to expose a part of the first conductivity type semiconductor layer 520.

Figure 5D:
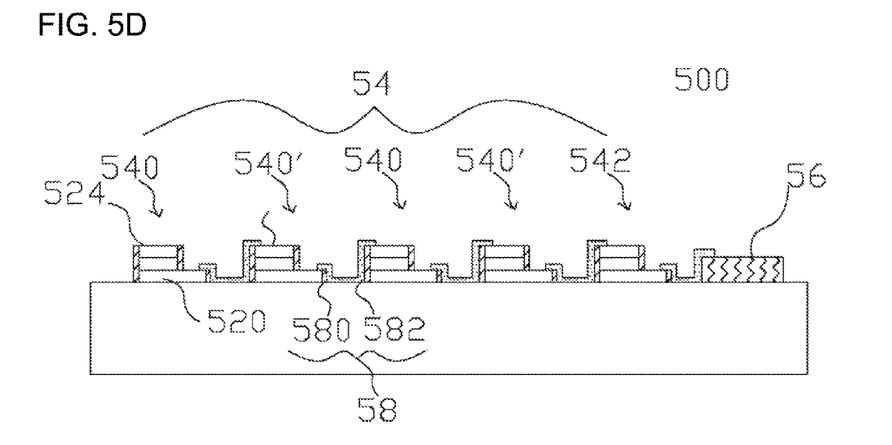

As shown in FIG. 5D, an electrode 56 is formed on the substrate 50 to electrically connect to the conductive trace on the submount (not shown). In addition, several electrical connection structures 58 are formed to electrically connect the different diode units 54 and the electrode 56. In the present embodiment, the electrical connection structure 58 includes an insulation layer 580 covering a sidewall of the diode unit 54, and a metal layer 582 arranged on the insulation layer 580.

Furthermore, the first conductivity type semiconductor layer 520 of the light-emitting diode unit 540 is electrically connected to the second conductivity type semiconductor layer 524 of the neighboring light-emitting diode unit 540'. With this arrangement, a serially-connected closed loop can be formed, and consequently the light-emitting diode array chip 500 is formed.

Figure 6:
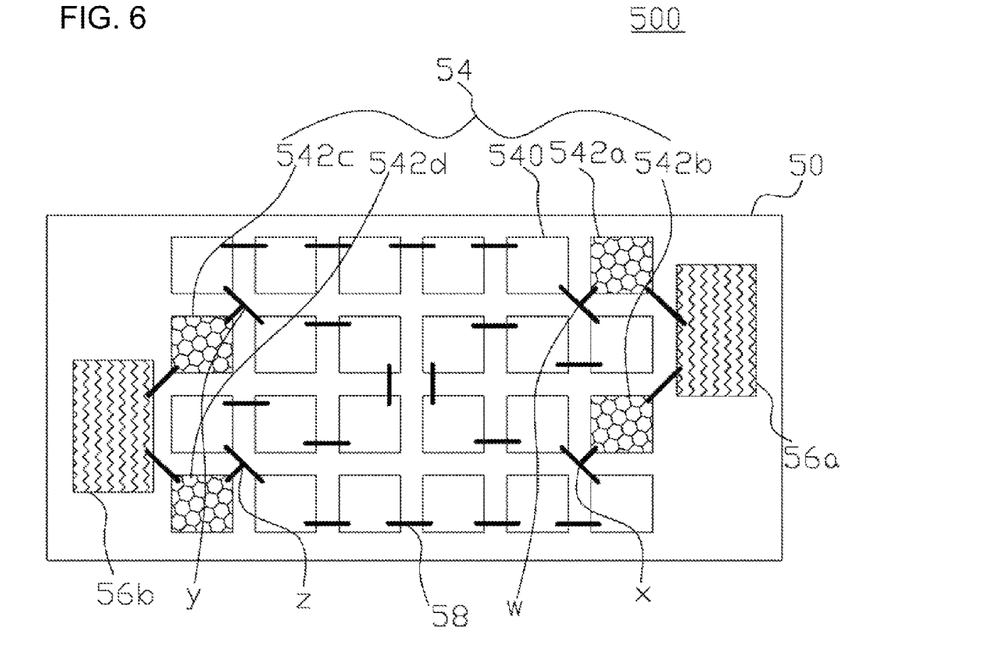
FIG. 6 is a top view of a light-emitting diode array chip in accordance with an embodiment of the present application.

As shown in FIG. 6, the light-emitting diode array chip 500 includes a substrate 50, diode units 54 arranged on the substrate 50, electrodes 56a, 56b arranged on the substrate 50, and electrical connection structures 58 for connecting the diode units 54 and the electrodes 56a, 56b in series or parallel.

The diode units 54 include light-emitting diode units 540 and rectifying light-emitting diode units 542a, 542b, 542c, 542d. The electrode 56a is electrically connected to a first conductivity type semiconductor layer (not shown) of the rectifying light-emitting diode unit 542a and a second conductivity type semiconductor layer (not shown) of the rectifying light-emitting diode unit 542b by the electrical connection structures 58. The electrode 56b is electrically connected to a first conductivity type semiconductor layer (not shown) of the rectifying light-emitting diode unit 542c and a second conductivity type semiconductor layer (not shown) of the rectifying light-emitting diode unit 542d by the electrical connection structures 58. In addition, the light-emitting diode units 540 are arranged in a serially-connected closed loop. To form a bridge circuit, the rectifying light-emitting diode units 542a, 542b, 542c, 542d are respectively connected to different nodes w, x, y, z in the serially-connected closed loop. First and second segments S1 and S2 of the electrical connection structure 58 are respectively attached to the upper right corner C1 and lower right corner C2 of the upper left LED unit 540-1 configured to only emit light in a positive cycle, i.e., a positive half of a full cycle, by means of rectifying diode unit 542c as shown in FIG. 6. On the other hand, LED unit 540-2 in FIG. 6 is configured to emit light during the entire cycle.

Figure 7A:
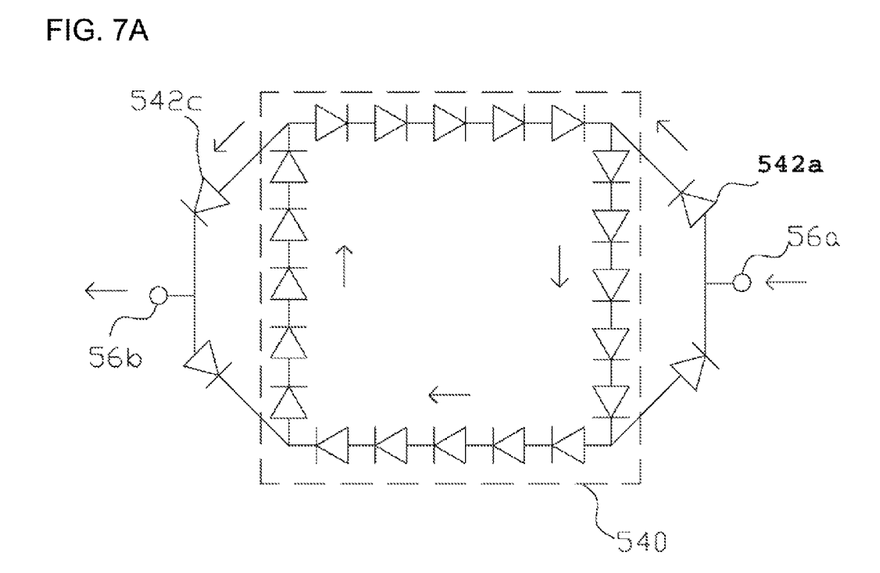
FIGS. 7A and 7B illustrate circuits of light-emitting diode array chips in accordance with embodiments of the present application.
Figure 7B:
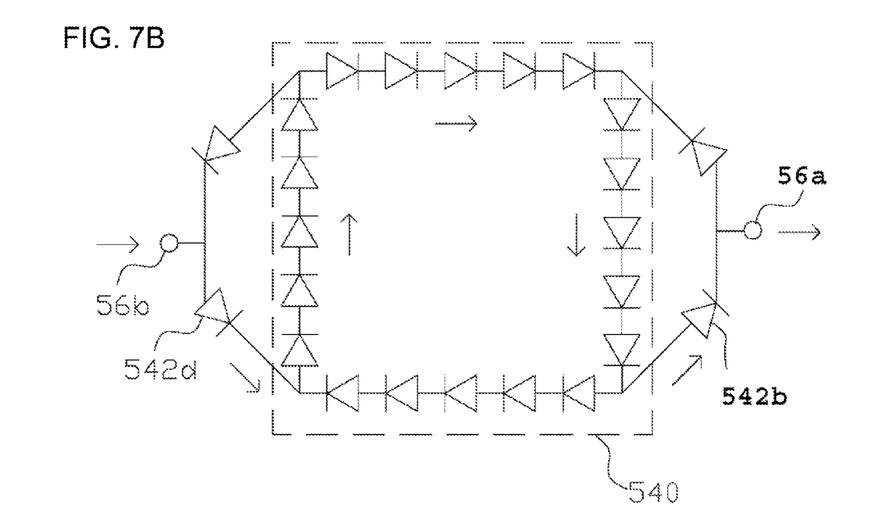

FIGS. 7A and 7B illustrate equivalent circuits of the aforementioned light-emitting diode array chips. The arrow indicates the current direction in the light-emitting diode array chip. As shown in FIG. 7A, the current, which is injected into the light-emitting diode array chip 500 via the electrode 56a, flows through the rectifying light-emitting diode unit 542a, some light-emitting diode units 540 in the closed loop (the path is indicated by the arrows), and the rectifying light-emitting diode unit 542c before leaving the light-emitting diode array chip 500 via the electrode 56b. In another case, as shown in FIG. 7B, the current, which is injected into the light-emitting diode array chip 500 via the electrode 56b, flows through the rectifying light-emitting diode unit 542d, some light-emitting diode units 540 in the closed loop (the path is indicated by the arrows), and the rectifying light-emitting diode unit 542b before leaving the light-emitting diode array chip 500 via the electrode 56a.

Figure 8:
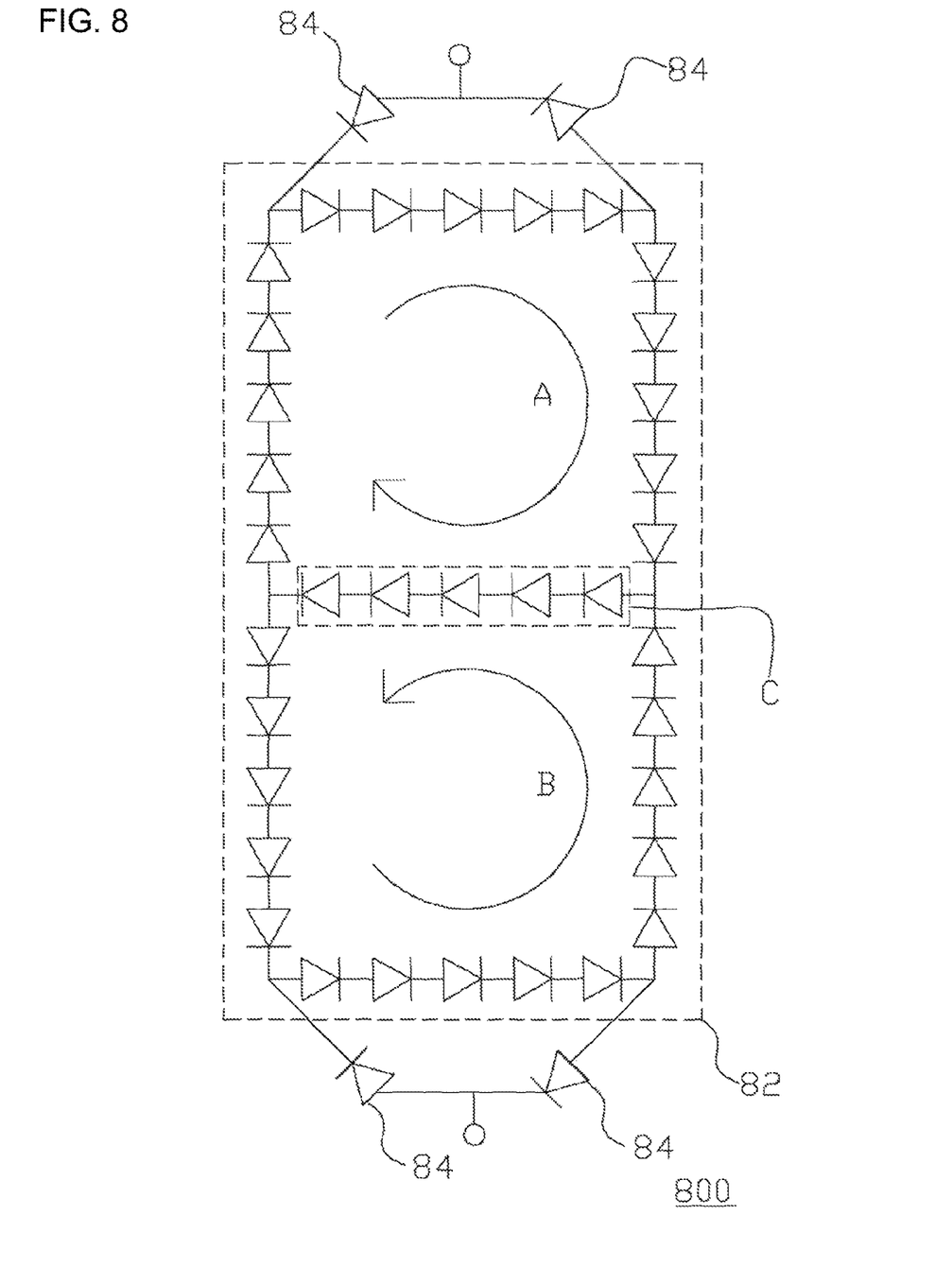
FIG. 8 illustrates another circuit of a light-emitting diode array chip in accordance with an embodiment of the present application.

As shown in FIG. 8, in the light-emitting diode array chip 800, several light-emitting diode units 82 are arranged to form serially-connected closed loops A, B and a common circuit C. The closed loops adjoining with each other have different connection directions. In the present embodiment, the closed loop A is connected in clockwise direction; the closed loop B is connected in a counterclockwise direction. Moreover, there is at least one common circuit C between the adjoining closed loops A and B. In addition, the light-emitting diode array chip 800 includes several rectifying diode units 84 which are respectively connected to four nodes in the closed loops A and B to form a bridge circuit which can provide a rectifying function.

Although the invention is explained above, it is not limited the range, the sequence in practice, the material in practice, or the method in practice. Any modification or decoration for this invention is not away from the spirit and the range of this invention.

What is claimed is:

1. A light-emitting device configured to operate under an AC input with a positive cycle and a negative cycle, comprising:
   a submount;
   an electronic element arranged on the submount;
   a blue light-emitting diode array chip arranged on the submount, and comprising:
      a first substrate; and
      a plurality of blue light-emitting diode units commonly formed on the first substrate and comprising a first blue light-emitting diode unit configured to only emit light in the positive cycle and having a first corner and a second corner formed on a same side, and a second blue light-emitting diode unit configured to emit light in the positive cycle and the negative cycle;
   a red light-emitting diode chip arranged on the submount and comprising:
      a second substrate; and
      a red light-emitting diode unit formed on the second substrate; and
   a conductive trace, arranged on the submount, electrically connecting the electronic element with the blue light-emitting diode array chip and the red light-emitting diode chip; and
   an electrical connection structure comprising a plurality of segments, with a first segment physically connected to the first corner and a second segment physically connected to the second corner.

2. The light-emitting device of claim 1, wherein the electronic element is a rectifier, a resistor, a capacitor, or an inductor.

3. The light-emitting device of claim 1, wherein the plurality of the blue light-emitting units is connected with each other in series, parallel, or a combination thereof.

4. The light-emitting device of claim 1, wherein the blue light-emitting diode array chip comprises a plurality of rectifying diode units, the first blue light-emitting diode unit is absent from the plurality of rectifying diode units.

5. The light-emitting device of claim 4, wherein the plurality of blue light-emitting diode units are arranged in a configuration comprising a first closed loop and a second closed loop, the plurality of rectifying diode units are absent from the first closed loop, the second closed loop, or both thereof.

6. The light-emitting device of claim 1, wherein the first segment and the second segment extend in different directions.

7. The light-emitting device of claim 1, wherein the AC input is a voltage of 100 V-240 V.

8. The light-emitting device of claim 1, wherein the submount comprises a recess structure for accommodating the electronic element or the blue light emitting diode array chip.

9. The light-emitting device of claim 1, further comprising a reflecting layer arranged on the submount.

10. The light-emitting device of claim 1, further comprising a wavelength converting layer arranged on the blue light-emitting diode array chip.

11. The light-emitting device of claim 10, wherein the wavelength converting layer comprises a yellow phosphor or a green phosphor.

12. The light-emitting device of claim 10, wherein the light-emitting device is configured to emit a white light having a color temperature of 2000K~3500K.

13. The light-emitting device of claim 1, further comprising an encapsulation material covering the blue light-emitting diode array chip.

14. The light-emitting device of claim 1, wherein the power ratio of the blue light-emitting diode array chip to the red light-emitting diode chip is between 2 and 4.

15. The light-emitting device of claim 1, wherein the plurality of blue light-emitting diode units comprises a third blue light-emitting diode unit separated from the first blue light-emitting diode by the second blue light-emitting diode unit, wherein the blue light-emitting diode array chip comprises a plurality of rectifying diode units, the third blue light-emitting diode unit being absent from the plurality of rectifying diodes.

* * * * *